United States Patent
Ang et al.

(10) Patent No.: US 7,562,318 B2
(45) Date of Patent: Jul. 14, 2009

(54) TEST STRUCTURE FOR AUTOMATIC DYNAMIC NEGATIVE-BIAS TEMPERATURE INSTABILITY TESTING

(75) Inventors: Chew Hoe Ang, Singapore (SG); Gang Chen, Singapore (SG); Shyue Seng Tan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 415 days.

(21) Appl. No.: 11/458,345

(22) Filed: Jul. 18, 2006

(65) Prior Publication Data
US 2006/0282804 A1    Dec. 14, 2006

Related U.S. Application Data

(62) Division of application No. 10/864,951, filed on Jun. 10, 2004, now Pat. No. 7,103,861.

(51) Int. Cl.
*G06F 17/50*    (2006.01)

(52) U.S. Cl. .................................. 716/4; 716/1; 716/19

(58) Field of Classification Search ................... 716/1, 716/4, 19
See application file for complete search history.

(56) References Cited

U.S. PATENT DOCUMENTS

2001/0030568 A1 * 10/2001 Zanardi et al. ............... 327/306
2005/0134394 A1   6/2005 Liu

* cited by examiner

*Primary Examiner*—Thuan Do (57) ABSTRACT

The invention describes a novel test structure and process to create the structure for performing automatic dynamic stress testing of PMOS devices for Negative Bias Temperature Instability (NB TI). The invention consists of an integrated inverter, two integrated electronic switches for switching from stress mode to device DC characterization measurement mode, and a PMOS FET device under test (DUT). The inverter assures the proper 180 degree phase relationship between the test device source and gate voltage while the imbedded electronic switches provide isolation of the test device during DC characterization testing. Another embodiment of the invention enables the testing of multiple devices under test (DUTs).

22 Claims, 6 Drawing Sheets

During stress,
- Vpulse = gate pulse varies between 0 and Vdd
- Vdd = Vdd
- Vss = 0V
- Vc = Vdd
- Vd = floating
- Vg = floating During measurement,
- Vpulse = floating
- Vdd = Vdd
- Vss = 0V
- Vc = negative voltage
- Vd = Vd depending on measurement condition
- Vg = Vg depending on measurement condition

TEST STRUCTURE FOR AUTOMATIC DYNAMIC NEGATIVE-BIAS TEMPERATURE INSTABILITY TESTING

CROSS-REFERENCE TO RELATED APPLICATION(S)

This is a divisional of application Ser. No. 10/864,951 filed Jun. 10, 2004, which is hereby incorporated by reference thereto.

BACKGROUND OF THE INVENTION (1) Field of the Invention

The present invention relates generally to a novel test structure and process for automatic Dynamic Negative-Bias Temperature Instability (DNBTI) testing of semiconductor devices to improve device reliability and performance.

(2) Description of Prior Art

As feature sizes for semiconductor devices decrease, along with the decrease in thickness of gate oxide layers, Negative Bias Temperature Instability (NBTI) has become an increasing reliability and performance concern. NBTI is not limited exclusively to short channel devices, but is directly related to device size reduction in the vertical direction. The theory of the NBTI degradation mechanism is complex, but is generally believed to be caused by the generation of interface traps in the device silicon generated by negative bias and accelerated by high temperature. These interface traps cause degeneration of device threshold characteristics, particularly for PMOS devices. It is therefore most important to test and model the lifetime of PMOS devices used in integrated circuits to assure proper circuit operation over device lifetime.

The conventional prior art method of determining device margin, and hence lifetime, for PMOS devices has been a constant voltage DC gate stress, often combined with high ambient stress test temperature.

High ambient stress was deemed important because it has been found that for devices that are subject to high-temperature conditions, whether due to the chips own heat dissipation or the environment in which the chip is used, NBTI failures will occur which would not be projected by the prior art burn-in testing alone, or prior art DC stress testing alone.

Figure 1:
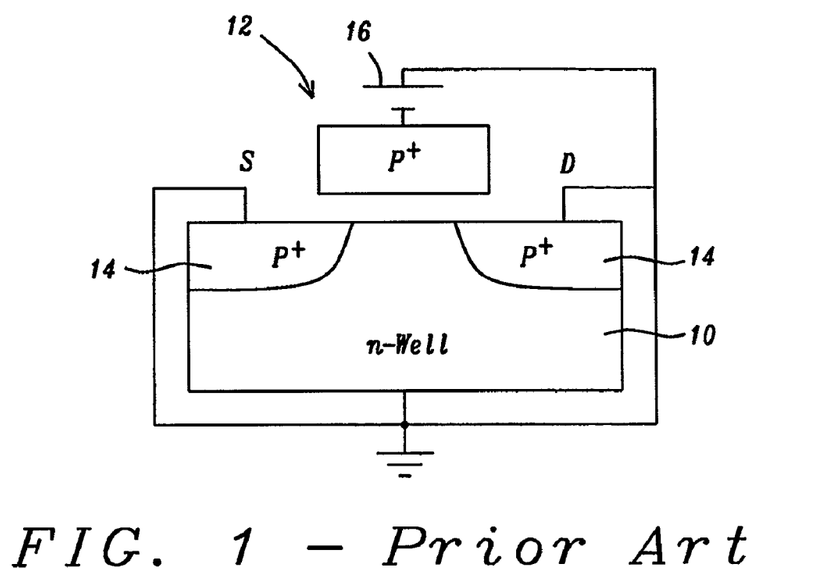
FIG. 1 illustrates a schematic representation of a prior art setup for Static Negative Bias Temperature Instability (SN-BTI) showing a PMOS FET device with a negative voltage bias on the gate and ground on the source/drain and substrate/N-well.

A conventional DC gate stress test configuration is illustrated in FIG. 1. As shown in the figure, a constant negative DC bias is applied to the gate electrode 16 of a PMOS transistor 12. The Source/Drain (S/D) 14 of the transistor as well as the channel substrate or N-well 10 is grounded. The test is most commonly performed at high temperature, typically 100 degrees Centigrade (° C.). Periodic measurements are made of device characteristics, and by modeling lifetime projections are made.

Figure 2A:
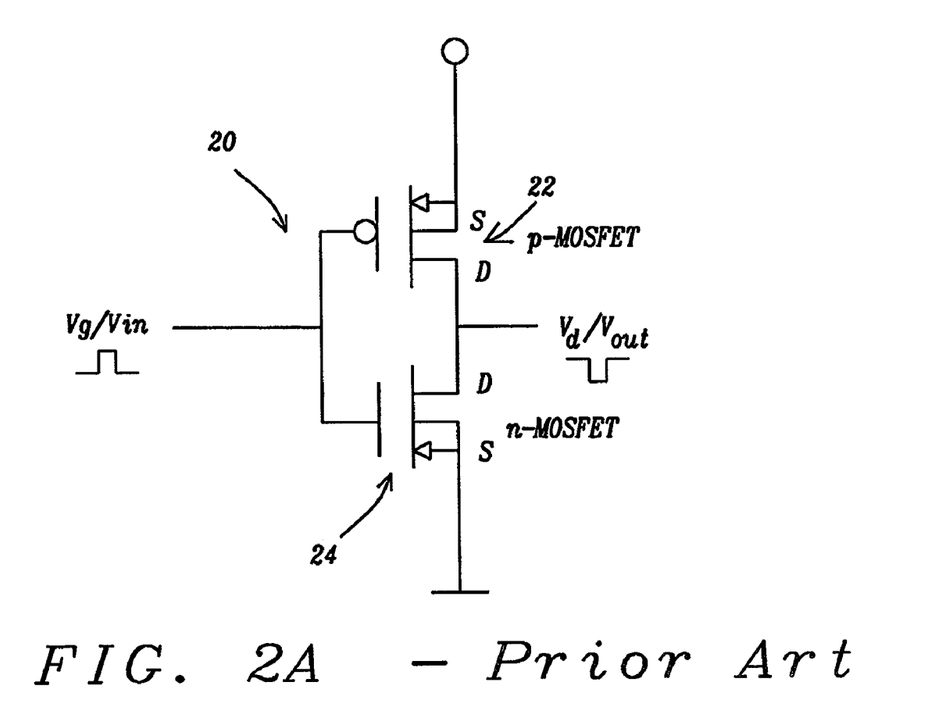
FIG. 2(A) is a simplified schematic representation of a prior art complimentary MOS inverter (CMOS) with a PMOS and NMOS FET.

However, the PMOS device is most typically used in a complimentary PMOS-NMOS or inverter configuration 22 shown in Prior Art FIG. 2(A). This circuit configuration is typically used in dynamic applications, not static or DC. The amount of device degradation due to Negative-Bias Temperature Instability (NBTI) is not constant for each device, but is a function of the devices unique switching activity within each circuit, that is, the device dynamic situation.

This is discussed in the paper "Dynamic NBTI of P-MOS Transistors and its Impact on MOSFET Scaling" by G. Chen, M. F. Li, C. H. Ang, J. Z. Zehng, and D. L. Kwong, IEEE Electron Device Letters, vol. 23, pp. 74-736, December 2002. The paper shows a nominal 10 times lifetime scaling for a dynamic projection over a static one.

Figure 2B:
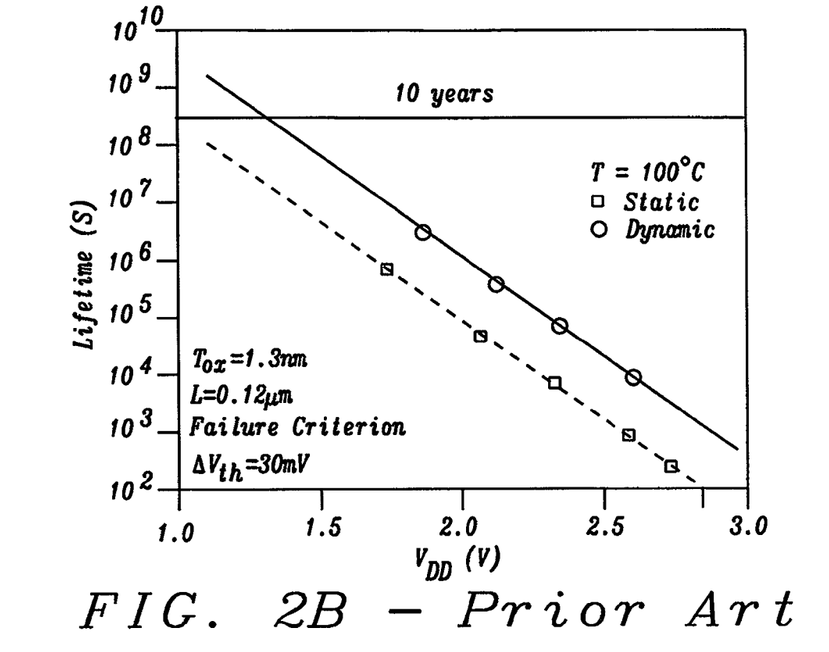
FIG. 2(B) is a graph showing lifetime projection for PMOS FETs with a gate oxide thickness of 1.3 nm for both static and dynamic NBTI stress.

This is illustrated in the referenced papers FIG. 4 and reproduced here as prior art FIG. 2(B) for convenience. The improvement in lifetime projection is attributed to what the reference paper calls, "electric passivation" (EP). This "EP" occurs during the "off" or "low output" cycle of the inverter, when a positive voltage is present at the PMOS gate.

Prior art FIG. 2(A), shows that during the dynamic operation of a P-MOS FET (22) in a CMOS inverter (20) the applied gate test bias (Vg/Vin) is switched between "high" and "low" voltages, while the drain bias (Vd/Vout) is correspondingly alternating between "low" and "high" voltages. This is the dynamic test condition for Dynamic Negative-Bias Temperature Instability (DNBTI).

As mentioned, FIG. 2(B) compares the lifetime projection for both Static NBTI (SNBTI) as tested in FIG. 1, and Dynamic (DNBTI) as tested in FIG. 2(A). As shown in FIG. 2(B), under the same stress voltage, the lifetime predicted by DNBTI is approximately a magnitude longer than predicted by SNBTI. Therefore, it is critically important for integrated circuits to investigate NBTI under such dynamic-stress conditions.

Figure 3A:
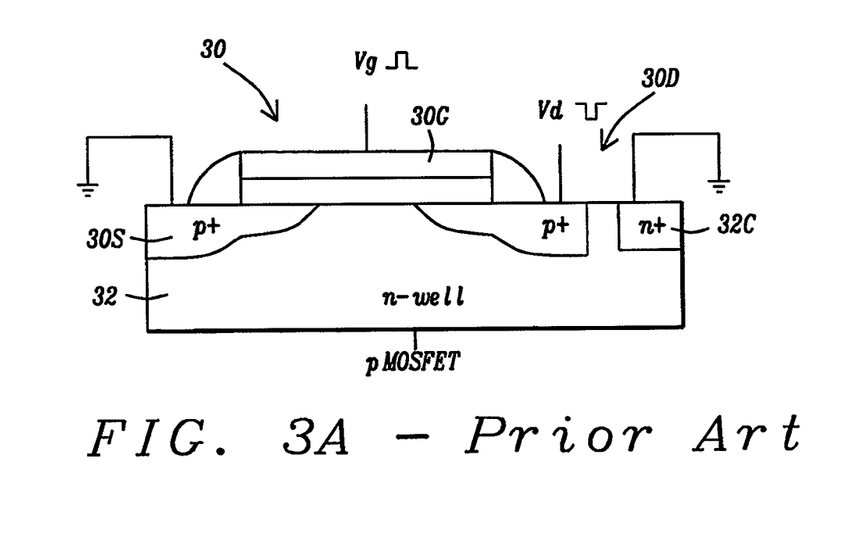
FIG. 3(A) is a prior art simplified cross section of a PMOS FET undergoing dynamic NBTI testing showing pulses on the gate and drain that are 180 degrees apart in phase relationship.

FIG. 3A outlines an actual test setup for DNBTI as illustrated on a cross section representation of a PMOS device. To simulate the DNBTI condition, a train of square waves Vg switching between "high" and "low" voltages is applied to the gate 30G, while the drain bias Vd is correspondingly alternating between "low" and "high" voltages, or 180 degrees phase shift from the gate voltage Vg.

Figure 3B:
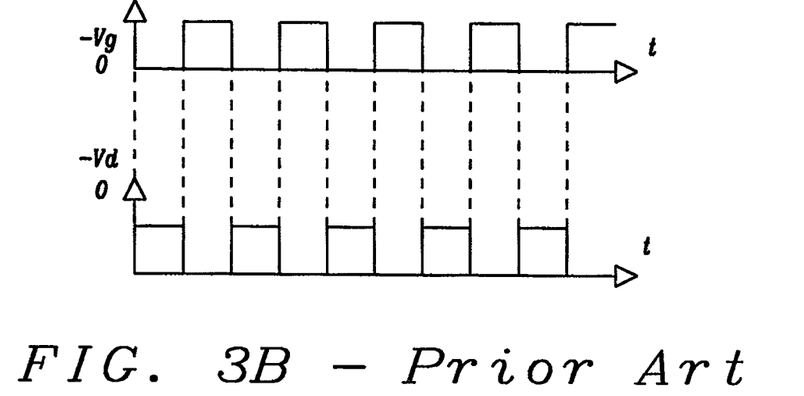
FIG. 3(B) is a prior art illustration of the required gate and drain pulse train and the 180-degree phase relationship for dynamic NBTI stress testing.

Representative opposite phase square wave trains are illustrated in Prior Art FIG. 3(B). A negative Vg turns the device 30 "on" causing the voltage at the drain 30D to go low. This drain voltage therefore is a 180-degree phase shift from the input or gate voltage.

Figure 3C:
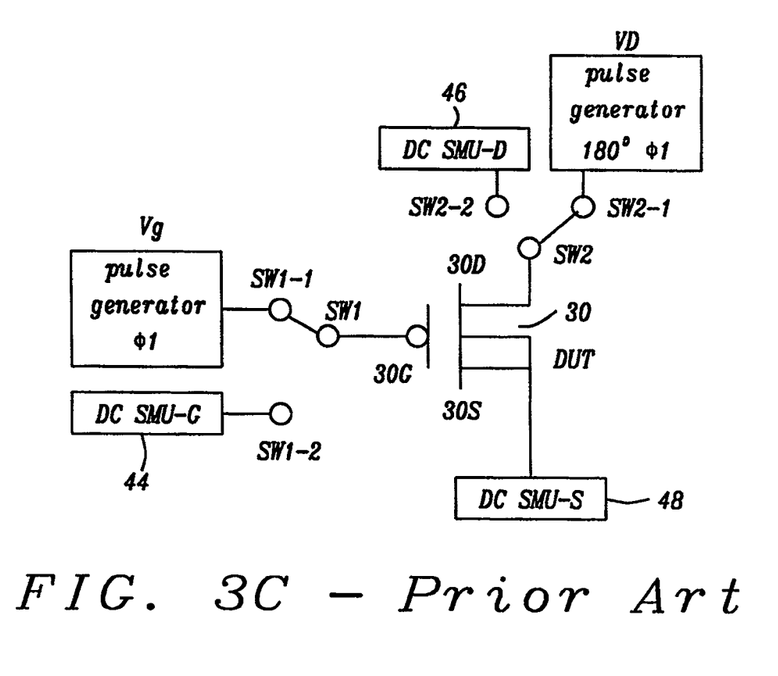
FIG. 3(C) is a prior art simplified illustration of a dynamic NBTI stress test setup showing a PMOS DUT and external pulse generators and measuring instrumentation (DCSMU).

The test setup is illustrated in Prior Art FIG. 3(C). A phase 1 pulse generator Vg is attached through switch SW 1 to the gate 30G of the PMOS device under test (DUT) 30. On the open pole SW 1-2 of switch SW 1 is-a block designated "DC SMU-G" 44 (DC Source Measurement Unit-Gate). This represents the instrumentation required to periodically monitor the DUT 30 operational characteristics, particularly threshold voltage.

The DUT 30 drain 30D is connected to the common pole of switch 2 SW2 that in turn is connected through the closed pole SW2-1 of switch SW2 to a second pulse generator Vd that is 180 degrees out of phase with the phase 1 pulse generator Vg. In order to simulate the DNBTI condition, a train of square waves Vg is applied to the gate 30G though switch SW1, and an opposite phase signal Vd is applied to the drain through switch SW2. Switching SW1 and SW2 to the DC Source Measurement Units 44, 46, will enable device characterization measurements. Upon completing the device measurements the switches are returned to the stress positions and the stress testing can continue.

It is a tedious job to make the phase relationship of the two pulses exactly opposite, or 180 degrees out of phase. Proper test voltage phase relationship is important to achieve meaningful test results. An external inverter could possibly alleviate the phase relationship adjustment; but external LC coupling can limit high frequency testing.

To summarize the external test setup requirements, two external pulse outputs are required along with two switches and several SMU units. Overall, the test setup can be tedious and time consuming, and could lead to misleading results if not done properly.

The following patents describe semiconductor and NBTI testing and modeling.

U.S. Pat. No. 6,653,856 (Liu) shows NBTI testing according to the prior art of the present invention.

U.S. Pat. No. 6,476,632 (LaRosa et al.) shows a ring oscillator design for MOSFET device reliability testing including NBTI testing.

U.S. Pat. No. 6,649,984 (Noda et al.) teaches bum-in testing using an inverter.

U.S. Pat. No. 6,521,469 (LaRosa et al.) discusses in-line testing for NBTI using hole injection.

U.S. Pat. No. 6,456,104 (Guarin et al.) discloses a test structure to externally apply a stress voltage to the gate.

U.S. Pat. No. 6,671,844 (Krech, Jr. et al.) shows a memory tester with multiple DUT testing.

US Patent Application 2003/0233624 (Reddy et al.) discloses testing discrete transistors for NBTI to estimate degradation of an Integrated circuit.

In addition to the above patents, the following technical reports discuss NBTI. "Dynamic NBTI of P-MOS Transistors and its Impact on MOSFET Scaling" by G. Chen, M. F. Li, C. H. Ang, J. Z. Zehng, and D. L. Kwong, IEEE Electron Device Letters, vol. 23, pp. 734-736, December 2002.

"Dynamic NBTI of P-MOS Transistors and its Impact on Device Lifetime" by G. Chen, K. Y. Chuah, M. F. Li, S. H. Chan, C. H. Ang, J. Z. Zheng, Y. Jin and D. L. Kwong, International Reliability Physics Symposium Proceeding, Dallas Tex. USA, pp. 196-202, April 2003.

SUMMARY OF THE INVENTION

Accordingly, it is the primary objective of the invention to provide a novel, effective structure and method for the automatic testing of semiconductor devices, in particular PMOS FET devices, to determine Dynamic Negative Bias Temperature Instability for device lifetime scaling and projection.

It is a further objective of the invention to enable this automatic testing with a minimum amount of external test equipment and setup time.

In addition, it is an objective of this invention to enable the testing to occur with exact test pulse train phase relationships regardless of frequency, and to minimize parasitic capacitance and LC coupling associated with external wiring.

It is yet another object of the invention to provide a method for forming the DNBTI testing using accepted manufacturing methods compatible with the required manufacturing and operating requirements of the devices being tested.

The above objectives are achieved in accordance with the embodiments of the invention that describes a novel test structure and process to create the structure. One embodiment of the invention consists of an integrated inverter, two integrated electronic switches for switching from stress mode to measurement mode, and a PMOS FET device under test (DUT). Another embodiment of the invention enables the testing of multiple devices under test (DUTs).

DESCRIPTION OF THE PREFERRED EMBODIMENTS

Figure 4A:
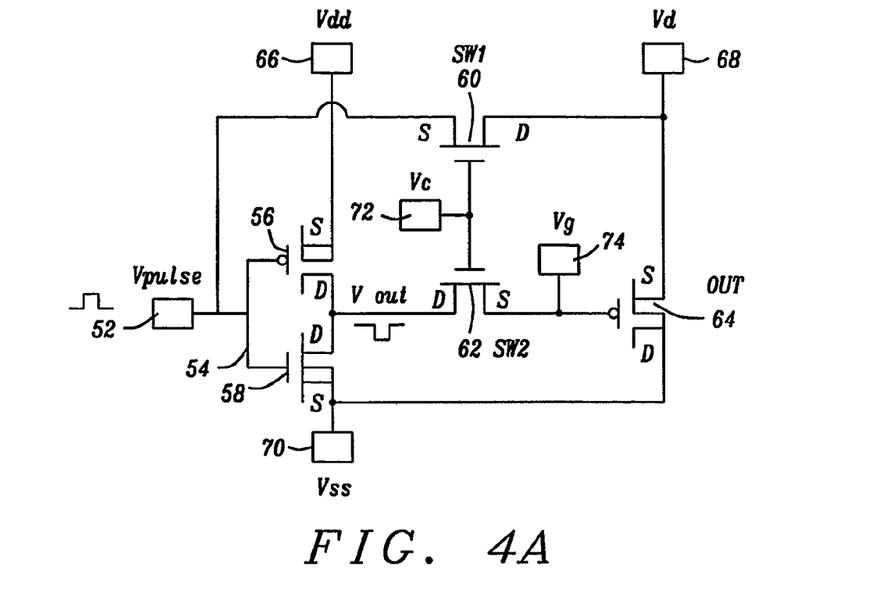
FIG. 4(A) is a schematic of one embodiment of the invention showing the integrated inverter, integrated electronic switches, and a PMOS FET DUT.

FIG. 4(A) shows one embodiment of the invention for simplified automatic dynamic testing of NBTI. The CMOS inverter 54 is incorporated into the silicon of the device to be tested.

The inverter consists of the PMOS device 56 in series with a NMOS device 58. The PMOS device 56 gate is connected to the gate of the NMOS device 58 and to a first voltage Vpulse input pad 52. The source of the PMOS device 56 is connected to a second voltage source Vdd. The gates are also connected to the source of the first integrated electronic switch 60. The drains of the two inverter FET devices are connected together and form the output of the inverter.

The inverter 54 output voltage Vout has a 180 degree phase relationship from the input first voltage Vpulse. This output Vout is then connected to the drain of the second integrated NMOS electronic switch 62.

The source of the inverter NMOS 58 is connected to a third voltage source, Vss, typically ground. The gates of the two electronic NMOS switches are connected together and to a fifth voltage source, Vc. The voltage Vc controls the switches simultaneously switching them to the "open" or "closed" positions.

The drain of the first electronic NMOS switch device 60 is connected to a fourth voltage source Vd, and to the source of the PMOS DUT 64. The source of the second electronic NMOS switch device 62 is connected to the gate of the PMOS DUT 64 and to a sixth voltage source Vg. The drain of the PMOS DUT is connected to the third voltage source Vss completing the DUT circuit.

Figure 4B:
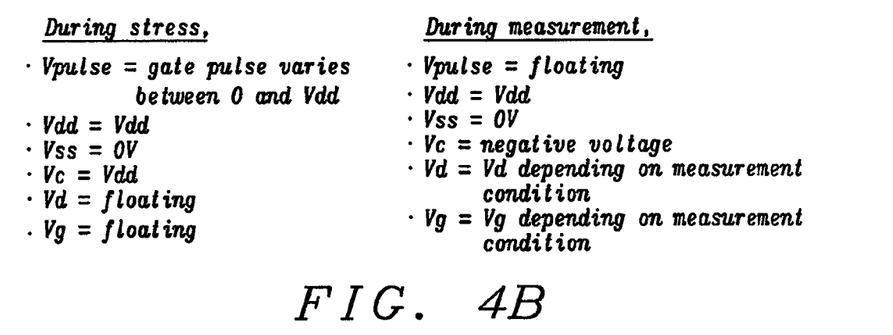
FIG. 4(B) is a table of invention circuit voltages for the stress cycle and the measurement cycle.

The voltage sequence for stress test and measurement test is shown in the table of FIG. 4B which is repeated here as table 1 for convenience.

TABLE ONE

| | DNBTI TEST VOLTAGE CONDITIONS | |
| --- | --- | --- |
| | DURING STRESS | DURING MEASUREMENT |
| Vpulse | Varies between 0 and Vdd | Floating |

TABLE ONE-continued

DNBTI TEST VOLTAGE CONDITIONS

| | DURING STRESS | DURING MEASUREMENT |
|---|---|---|
| Vdd | Vdd | Vdd |
| Vss | 0 Volt (Gnd) | 0 Volt (Gnd) |
| Vc | Vdd | Negative Voltage |
| Vd | Floating | Dependent on measurement condition |
| Vg | Floating | Dependent on measurement condition |

Referring to the voltage table and FIG. 4(A) it is shown that for the DNBTI stress test portion of the cycle, a square pulse with periodic waveform is applied to pad 52. The pulse magnitude varies between a high of Vdd and a low of zero volts. During the positive or Vdd portion of the cycle, the inverter circuit 54 PMOS device 56 is turned off and the inverter NMOS device 58 is turned on. This places the inverter output voltage Vout at a low state approaching Vss or ground, a 180 degree phase shift from the input voltage.

As noted in the voltage table, during the stress test the electronic switch gate voltage, Vc, is held at a voltage level equivalent to Vdd. This positive voltage holds both electronic switch devices 60, 62 in the "on" or closed state. Since the fifth voltage source Vg is in the floating state during the stress portion of the cycle, the low inverter output voltage Vout essentially appears on the gate of the PMOS FET DUT 64.

Concurrently, during the high or Vdd cycle of Vpulse, the high Vdd voltage is passed through the closed first electronic switch 60 and onto the source of the PMOS DUT to 64. There is no conflict with the voltage Vd as Vd is floating during this portion of the test. The positive high source voltage and low gate voltage essentially reverse biases the gate to source of the PMOS DUT 64, providing the negative bias stress.

As the input pulse Vpulse switches from a high of Vdd to 0 volts, the inverter 54 devices also switch state with the inverter PMOS 56 turning on and the inverter NMOS 58 turning off. This puts the inverter 54 output voltage Vout at essentially Vdd which is fed through the closed second electronic switch 62 to the gate of the PMOS DUT 64.

This places a positive voltage or bias on the gate of the DUT 64 on alternate cycles from the essentially negative gate bias cycle. Because of the function of the imbedded inverter the pulses are effectively self-synchronized and therefore always 180 degrees out of phase. There is no conflict with the voltage Vg as Vg is floating during this portion of the test.

Because the inverter is imbedded, the stray capacitance and inductance are minimized over those of an external setup. The same is true for the imbedded electronic switches; the stray elements are minimized over that of an external network. This enables the invention device to operate at higher frequencies than external circuits and more closely emulate actual circuit operating frequencies where required.

Figure 5:
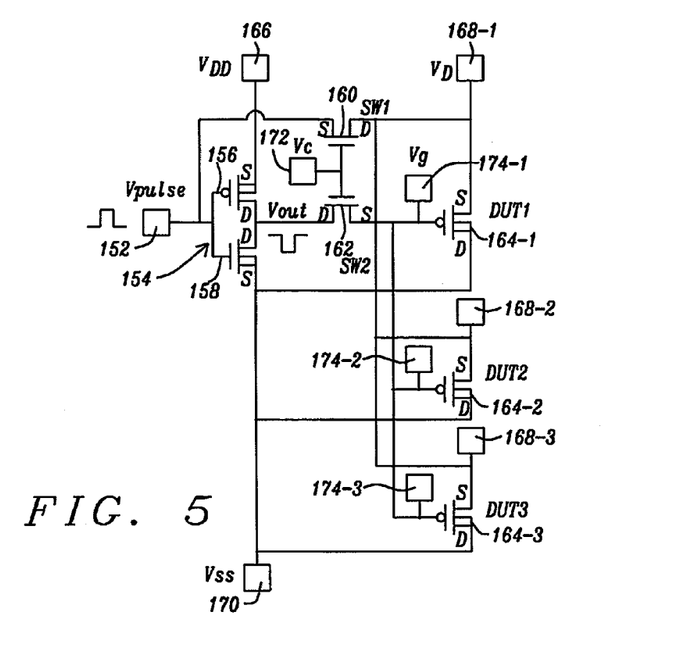
FIG. 5 is a schematic of another embodiment of the invention showing the integrated inverter and electronic switches and multiple PMOS DUTs.

FIG. 5 depicts another embodiment of the invention enabling the dynamic stress testing of multiple devices. Again, there is an imbedded CMOS inverter 154 with a dynamic test first voltage Vpulse as input to the connected gates of the PMOS 156 and NMOS 158 of the inverter. The first voltage Vpulse is also tied to the source of the first electronic switch 160. The source of the inverter PMOS 156 is connected to a second voltage source Vdd, while the inverter PMOS 156 drain is connected to the inverter NMOS 158 drain and to the drain of the second electronic switch 162. The source of the inverter NMOS 158 is connected to a third voltage source Vss, typically ground.

The gates of the two electronic NMOS switch devices 160, 162 are tied together and to a fifth voltage source Vc. The Vc voltage input controls the electronic switches to convert the circuit from stress mode to device characteristics measurement mode. The drain of the first electronic switch 160 is attached to a fourth voltage source Vd and the multiple source elements of multiple PMOS DUTs 164-1, 164-2, 164-3. The multiple DUTs source elements are also tied to multiple voltage sources of the fourth voltage Vd, 168-1, 168-2, and 168-3. These voltages are used during the DC measurement of the DUTs operating characteristics.

The source of the second NMOS electronic switch device 162 is connected to the gates of multiple PMOS DUTs 164-1, 164-2, and 164-3. The DUT gates are also connected to multiple sources of the sixth voltage, Vg as indicated by elements 174-1, 174-2 and 174-3. These voltages are used during the measurement for each of the DUTs DC characteristics.

The drains of the multiple DUTs 164-1, 164-2 and 164-3 are connected to the third voltage source Vss, typically ground through metal contact pad 170.

The various voltage sequences are the same as listed in Table One. Therefore, when the first voltage source Vpulse is in the high or Vdd mode, the inverter circuit 154 PMOS device 156 is off, the inverter NMOS device 158 is on, and the output voltage Vout is low or approximately ground and 180 degrees out of phase with the input Vpulse.

During the stress portion of the test, the fifth voltage source Vc as applied through pad 172 is at the Vdd level maintaining the two electronic switches 160 and 162 in the "on" or closed position. Therefore the high voltage mode of Vpulse is transferred through the closed first electronic switch 160 to the source elements of the multiple DUTs 164-1, 164-2, and 164-3. At the same time the gate elements of the multiple DUTs 164-1, 164-2, 164-3 are at a low level from the output of the inverter being fed through closed electronic switch 2 162. This essentially places a negative bias on the multiple DUT gates.

During the low voltage level of the input voltage Vpulse the inverter 154 switches essentially placing the positive voltage Vdd on the gates and zero voltage on the sources of the multiple DUT's 164-1, 164-2, and 164-3. Again, the characteristics of an inverter are such that the phase relationship between the source and gate stress test voltages are precisely maintained at all times. Also because the inverter is imbedded within the silicon substrate the undesirable parasitic elements are minimized over that of an external test setup.

Figure 6:
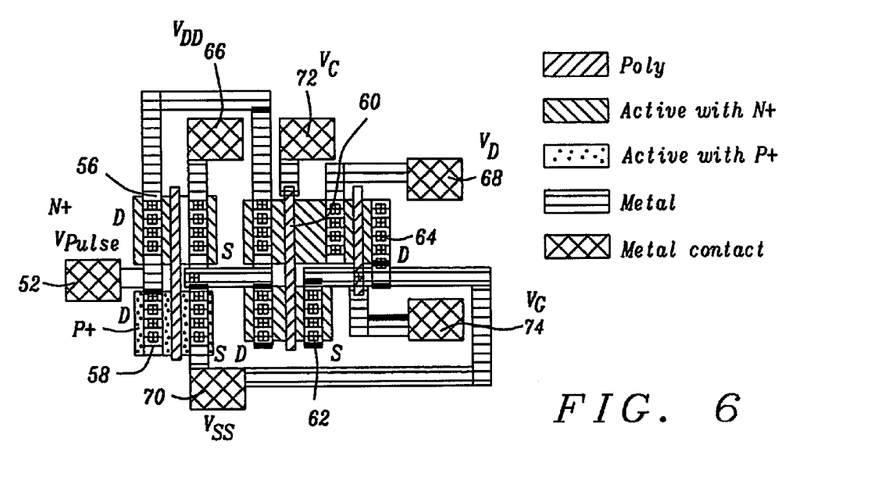
FIG. 6 showing one possible horizontal topographical layout of the first embodiment of the invention.

FIG. 6 shows a horizontal topographic layout of the first embodiment of the invention. The input voltage Vpulse pad 52 is connected to the gate connection of the inverter PMOS 56 and inverter NMOS 58 and the source of the first electronic switch 60. The source of the inverter PMOS is connected to the second voltage Vdd pad 66 and the drain of the inverter NMOS is connected to the third Voltage Vss pad 70.

The inverter output is connected by metal 1 to the drain of the second NMOS switch 62, and the source of the switch 62 is connected to gate of the PMOS under test 64 and the sixth voltage Vg pad 74. The drain of the first switch 60 is connected to the fourth voltage Vd pad 68 and the source of the PMOS under test 64. The drain of the PMOS under test is connected by metal 1 to the third voltage Vss pad 70.

Figure 7:
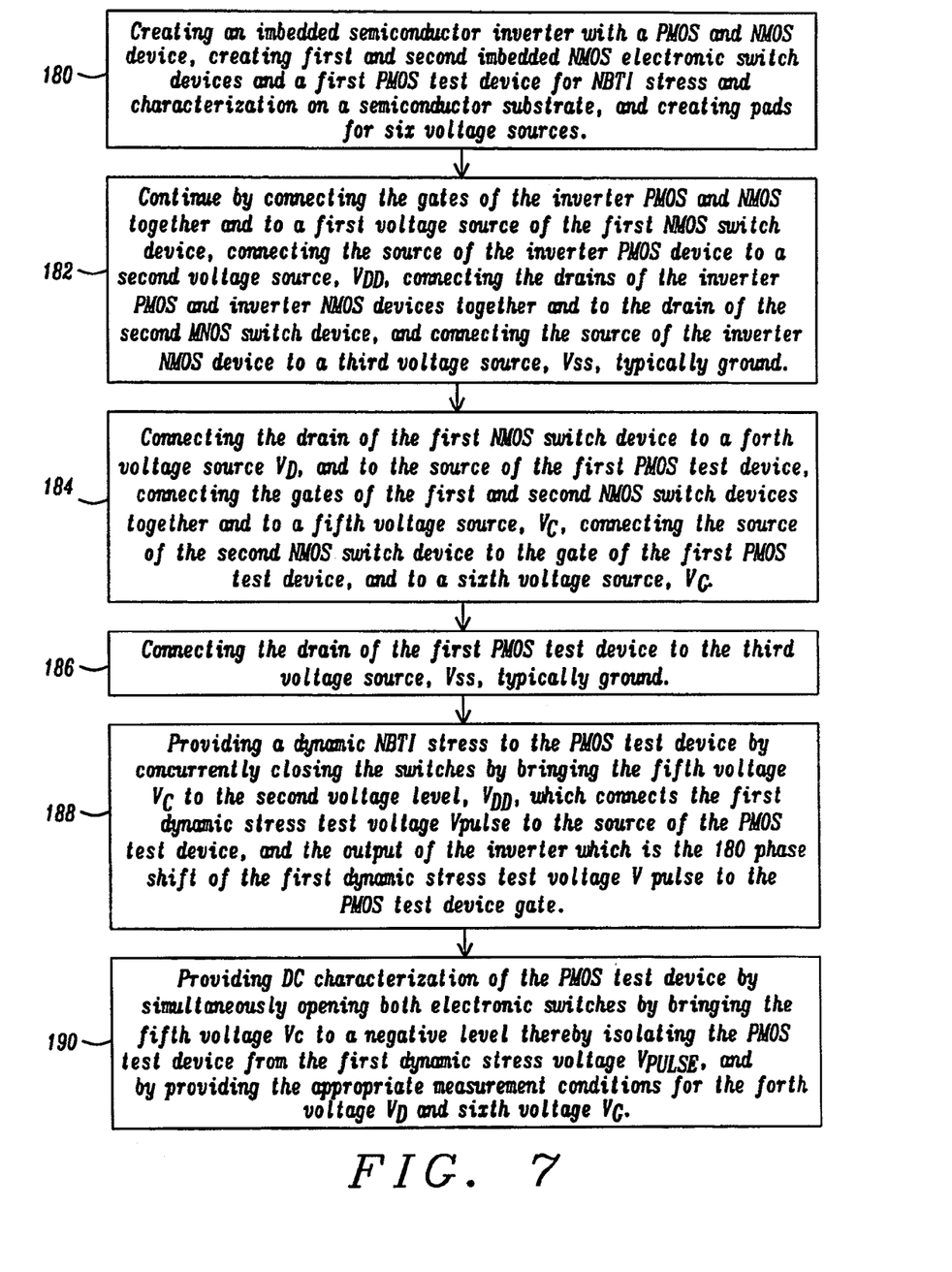
FIG. 7 is a flow diagram for the process to develop the first embodiment of the invention.

Referring to FIG. 7, the first embodiment of the invention can be formed in the following manner. First, by creating an imbedded semiconductor inverter with a PMOS and a NMOS device as indicated in element 180. Then creating first and second imbedded NMOS electronic switch devices and a first imbedded PMOS test device for NBTI stress and characterization testing on a semiconductor substrate. Furthermore, as indicated in element 180, creating connection pads for six voltage sources provides voltage inputs to the circuit.

The process is continued as indicated in element 182 of FIG. 7 by connecting the gates of the inverter PMOS and NMOS devices together and to a dynamic stress test first voltage source, Vpulse, and to the source of the first NMOS switch device. Continue by connecting the source of the inverter PMOS device to a second voltage source, Vdd and connecting the drains of the inverter PMOS and NMOS devices together to form the inverter output, and also connecting the inverter output to the drain of the second NMOS switch device. Connecting the source of the inverter NMOS device to a third voltage source, Vss, typically ground, completes the inverter.

Connecting the gates of the first and second switch devices together and to a fifth voltage source, Vc, provides switch control. A path for enabling the dynamic stress first voltage Vpulse to be connect to the DUT is provided by connecting the drain of the first CMOS switch device to the source of the PMOS test device, and also to a fourth voltage source, Vd.

A path for the Vout, the 180 degree phase shift of the first voltage Vpulse input voltage, to the PMOS test device is formed by connecting the source of the second NMOS switch device to the gate of the PMOS test device. When the second NMOS switch device is closed, the Vout path is completed from the inverter devices drains to the device under test (DUT) gate. Connecting the gate of the PMOS DUT to a sixth voltage source, Vg, enables appropriate DUT DC characterization when required.

Connecting the drain of the PMOS test device to the third voltage source, Vss or ground completes the PMOS DUT circuit.

The stress test is conducted by bringing the fifth voltage source Vc to the level of Vdd. This has the effect of concurrently closing both the first and second electronic switches thereby connecting the input dynamic stress test first voltage Vpulse to the PMOS test device source. Closing the switches also provides a path for the 180 degree inverter output to the PMOS test device.

DC PMOS test device DC characterization is provided by simultaneously opening both switches by bringing the fifth voltage Vc to a negative level isolating the PMOS test device from the dynamic stress test voltages. Providing the appropriate test conditions for the fourth voltage Vd and the sixth voltage Vg then performs the characterization.

While the invention has been particularly shown and described with reference to the preferred embodiments thereof, it will be understood by those skilled in the art that various changes in form and details may be made without departing from the spirit and scope of the invention.

What is claimed is:

1. A reduced capacitance semiconductor test structure on a substrate to provide for the automatic dynamic stress and device characterization test of a semiconductor device for Negative Bias Temperature Instability comprising:
    a MOS dynamic stress test device;
    an input contact pad for a dynamic stress test first voltage;
    an inverter coupled to the input contact pad for controlling the phase relationship of said dynamic stress test first voltage;
    a first electronic switch device between said dynamic stress test first voltage and said MOS dynamic stress test device source element;
    a second electronic switch device between an inverter output and said MOS dynamic stress test device gate element;
    multiple contact pads for the application of second, third, fourth, fifth, and sixth voltages to the inverter, the first electronic switch, the second electronic switch, and the MOS dynamic stress test device; and
    the inverter including a PMOS and NMOS device employed in a CMOS inverter configuration with each device gate connected together to form the input and each device drain connected together to form the output, said PMOS device source connected to said second voltage, and said NMOS device source connected to said third voltage.

2. The test structure of claim 1 wherein said MOS dynamic stress test device is a PMOS device.

3. The test structure of claim 1 wherein said dynamic stress first voltage consists of a train of pulses with magnitude varying between 0 volts and the nominal circuit voltage Vdd.

4. The test structure of claim 1 wherein said second voltage is said inverter circuit nominal source voltage Vdd.

5. The test structure of claim 1 wherein said third voltage source is Vss or ground.

6. The test structure of claim 1 wherein said fourth voltage source is Vd, the test characterization voltage for said MOS test device source during said device characterization tests.

7. The test structure of claim 1 wherein said inverter provides an assured 180 phase relationship for said dynamic stress test first voltage.

8. The test structure of claim 1 wherein said first electronic switch enables a path for said dynamic stress test first voltage to be applied to said MOS test device source element during dynamic stress test, and provides electrical isolation during said MOS test device characterization tests.

9. The test structure of claim 1 wherein said second electronic switch element enables a path for said inverter output 180 degree inverse phase of said first voltage stress test voltage to be applied to said MOS test device gate during dynamic stress test, and provides electrical isolation during said MOS test device characterization tests.

10. The test structure of claim 1 wherein said fifth voltage source is Vc, said electronic switches gate voltage which provides control of said electronic switches to provide closed switch position during said MOS test device dynamic stress test and open switch position to isolate said MOS test device from said dynamic stress first voltage during said MOS test device characterization tests.

11. The test structure of claim 1 wherein said sixth voltage source is Vg, the test characterization voltage for said MOS test device gate during said MOS test device characterization tests.

12. A reduced capacitance semiconductor test structure on a substrate to provide for the automatic dynamic stress and device characterization test of semiconductor devices for Negative Bias Temperature instability comprising:
    multiple MOS dynamic stress test devices;
    a input contact pad for a dynamic stress test first voltage;
    an inverter coupled to the input contact pad for controlling the phase relationship of said dynamic stress test first to voltage;
    a first electronic switch device between said dynamic stress test first voltage and said multiple MOS dynamic stress test device source elements;
    a second electronic switch device between an inverter output and said multiple MOS dynamic stress test device gate elements;
    multiple contact pads for the application of second, third, fourth, fifth, and sixth voltages to the inverter, the first electronic switch, the second electronic switch, and the multiple MOS dynamic stress test devices; and the inverter including a PMOS and NMOS device employed in a CMOS inverter configuration with each device gate connected together to form the input and each drain connected together to form the output, said PMOS device source connected to said second voltage, and said NMOS device source connected to said third voltage.

13. The test structure of claim 12 wherein said multiple MOS dynamic stress test devices are PMOS devices.

14. The test structure of claim 12 wherein said dynamic stress first voltage consists of a train of pulses with magnitude varying between 0 volts and the nominal circuit voltage Vdd.

15. The test structure of claim 12 wherein said second voltage is said inverter circuit nominal source voltage Vdd.

16. The test structure of claim 12 wherein said third voltage source is Vss or ground.

17. The test structure of claim 12 wherein said fourth voltage source is Vd, the test characterization voltage for said multiple MOS test device sources during said device characterization tests.

18. The test structure of claim 12 wherein said inverter provides an assured 180 phase relationship for said dynamic stress test first voltage.

19. The test structure of claim 12 wherein said first electronic switch enables a path for said dynamic stress test first voltage to be applied to said multiple MOS test device source elements during dynamic stress test, and provides electrical isolation during said MOS test devices characterization tests.

20. The test structure of claim 12 wherein said second electronic switch element enables a path for said inverter output 180 degree inverse phase of said first voltage stress test voltage to be applied to said multiple MOS test device gates during dynamic stress test, and provides electrical isolation during said MOS test devices characterization tests.

21. The test structure of claim 12 wherein said fifth voltage source is Vc, said electronic switches gate voltage which provides control of said electronic switches to provide closed switch position during said multiple MOS test devices dynamic stress test and open switch position to isolate said multiple MOS test devices from said dynamic stress first voltage during said MOS test devices characterization tests.

22. The test structure of claim 12 wherein said sixth voltage source is Vg, the test characterization voltage for said multiple MOS test device gates during said MOS test devices characterization tests.

* * * * *